United States Patent [19]

Nishibe

[11] Patent Number: 4,737,942

[45] Date of Patent: Apr. 12, 1988

[54] TIME MEASURING DEVICE

[75] Inventor: Takashi Nishibe, Kanagawa, Japan

[73] Assignee: Fuji Electric Co., Ltd., Kanagawa, Japan

[21] Appl. No.: 37,152

[22] Filed: Apr. 10, 1987

[30] Foreign Application Priority Data

May 30, 1986 [JP] Japan ................................ 61-123418

[51] Int. Cl.$^4$ .......................... G04F 8/00; G01R 23/02

[52] U.S. Cl. .................................. 368/118; 324/78 D

[58] Field of Search ................................ 368/107-120; 324/78 R, 78 D; 377/20; 364/569

[56] References Cited

U.S. PATENT DOCUMENTS

| | | | |
|---|---|---|---|
| 4,020,418 | 4/1977 | Burrage | 324/78 D |
| 4,107,600 | 8/1978 | McMannis | 368/120 |
| 4,160,154 | 7/1979 | Jennings | 368/118 |

*Primary Examiner*—Vit W. Miska
*Attorney, Agent, or Firm*—Finnegan, Henderson, Farabow, Garrett and Dunner

[57] ABSTRACT

A time measuring device uses a clock pulse signal whose period is successively increased after a predetermined number of pulses is produced. The clock pulse signal is counted from the time when the earliest of a number of phenomena occurs.

7 Claims, 3 Drawing Sheets

TIME MEASURING DEVICE

BACKGROUND OF THE INVENTION

This invention relates generally to time measurement devices and particularly to devices for making parallel measurements of the times when different phenomena occur.

In an automatic focus camera (AFIC), the image of an object is formed on two light receiving element or photosensor arrays and the distance between the camera and the object is determined from the difference between the positions of the images on those arrays. To make that determination, some photosensor arrays use a system to measure photosensor response times and generate electrical signals representing the images. Many systems of this type are well known in the art.

FIG. 1 is a block diagram of a conventional time measuring system 10 which includes AND gates 12 (12*a* through 12*n*) and counters 13 (13*a* through 13*n*) to measure the times required for the outputs of photosensors 11 (11*a* through 11*n*) to reach a predetermined level. For example, if the outputs of photosensors 11 change from a high (H) level to a low (L) level when a desired response is sensed, counters 13 count the number of clock signals $\phi_0$ generated while the outputs of photosensor 11 remain at a high level. The response times of photosensors 11 thus correspond to the count values of counters 13.

With some modifications, system 10 can also be adapted to measure the time elapsed between the onsets of selected phenomena. Conventional time measurement systems, however, have inherent limitations.

In conventional systems for measuring the onset times of different phenomena, the amount of hardware increases not only with the number of phenomena to be measured but also with the length of the time durations to be measured. For instance, the measurement of a one second time duration with a 1 MHz clock signal requires a twenty stage binary counter ($10^6$ is approximately equal to $2^{20}$). In addition to the complexity of such systems, time measurement which involves an excessively large number of digits delays succeeding data processing operations and hinders the production of sufficiently effective results. This is even more of a disadvantage when the precision afforded by all the digits is not needed.

A solution to these problems of complexity and loss of effectiveness of conventional time measurement systems is premised on the realization that photosensor response times do not always need to be measured very precisely. Especially when the outputs of the sensors are quantized, often only the most significant data from the sensor arrays are needed for the the time measurement system to operate effectively.

Accordingly, an object of the invention is to provide a time measuring device which can perform effective time measurement with a relatively small amount of hardware.

SUMMARY OF THE INVENTION

To obtain the objects and provide the advantages of this invention, a device for measuring the time period between the onset of two phenomena comprises: input means for receiving occurrence signals indicating the onset of the phenomena; clock means, coupled to the input means, for generating a timing signal composed of repeating pulses with non-decreasing periods; and count means, coupled to the clock means and responsive to the occurrence signals, for counting the number of pulses of the timing signal generated by the clock means between the occurrence signals thereby to measure the time period between the onset of the phenomena.

DETAILED DESCRIPTION OF THE PREFERRED EMBODIMENT

Figure 1:
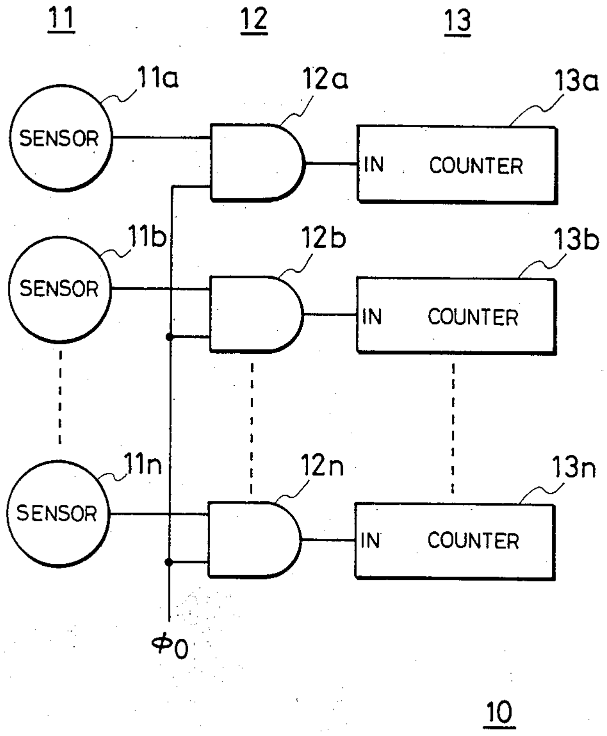
FIG. 1 is a diagram of a conventional time measuring system.
Figure 2:
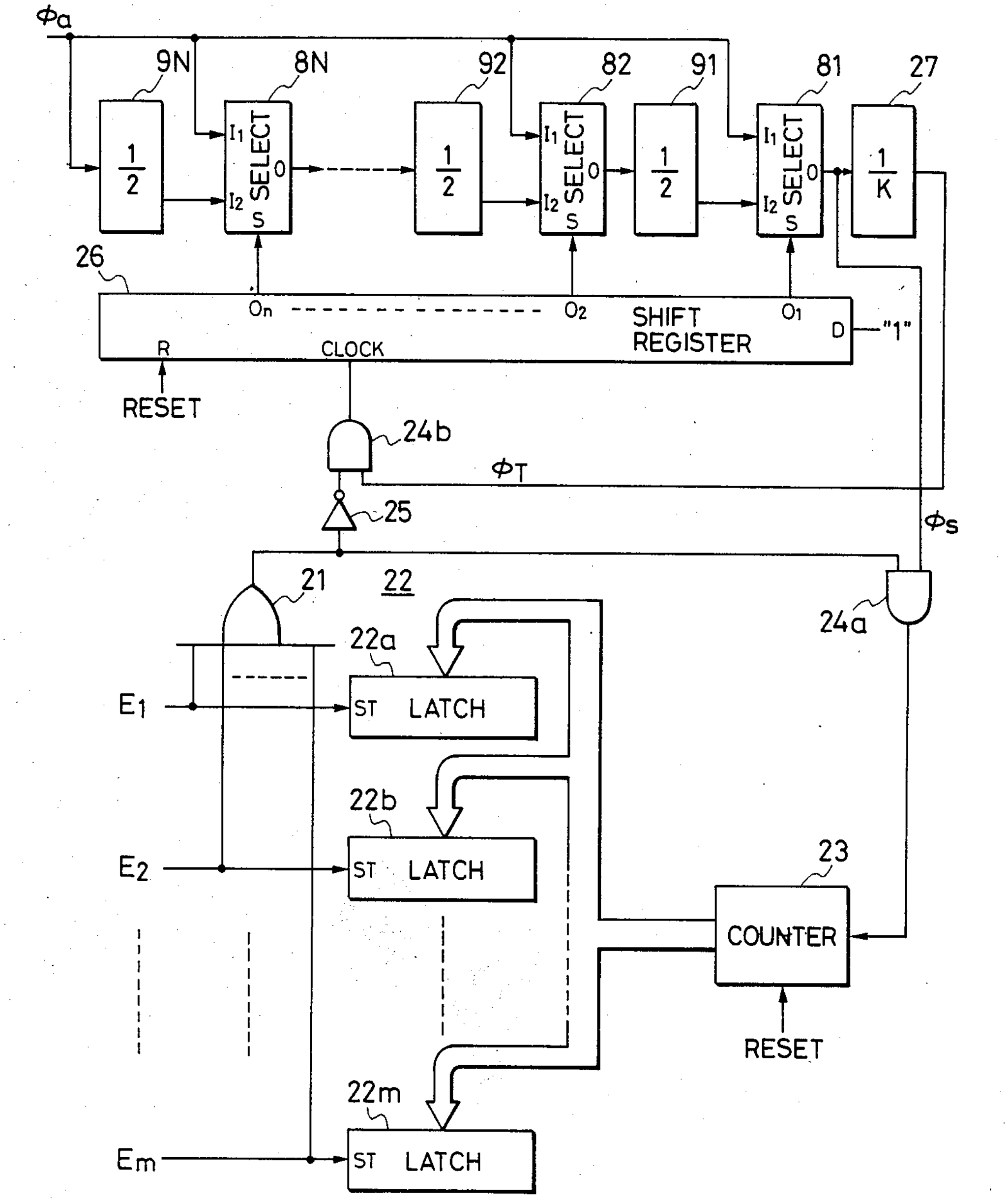
FIG. 2 is a diagram of one embodiment of the time measuring device of this invention.

FIG. 2 is a diagram of one embodiment of this invention. In FIG. 2, signals $E_1$ through $E_m$ each represent a different one of m phenomena to be time-measured. When a phenomenon occurs, the level of the corresponding signal E changes from "0" to "1."

In system 10, reference numeral 21 designates an OR gate and reference signals 22 (22*a* through 22*m*) designate latch circuits which latch the output of a counter 23 when the signals at their strobe input terminals ST are raised to "1" from "0." Reference characters 24*a*, 24*b*, 25, and 26 designate two AND gates, an inverter, and a shift register, respectively. In shift register 26, the parallel outputs $Q_1$ through $Q_n$ are all set to "0" when a reset signal RESET is applied to reset terminal R. Thereafter, whenever a clock signal is applied to the clock terminal of shift register 26, a "1" signal at an input terminal D is shifted from right to left until the outputs $Q_1$ through $Q_n$ are all equal to "1."

As FIG. 2 shows, system 10 also includes a 1/K frequency divider 27 (K being a positive integer) and select circuits 81, 82, . . . , 8N. In each of those select circuits, the signal at output O becomes the signal at input $I_2$ when the signal at input terminal S is at a "1" level, and the signal at output O becomes the signal at input $I_1$ when the signal at input terminal S is at a "0" level. Elements 91, 92, 93 . . . and 9N are each $\frac{1}{2}$ frequency dividers.

Figure 3:
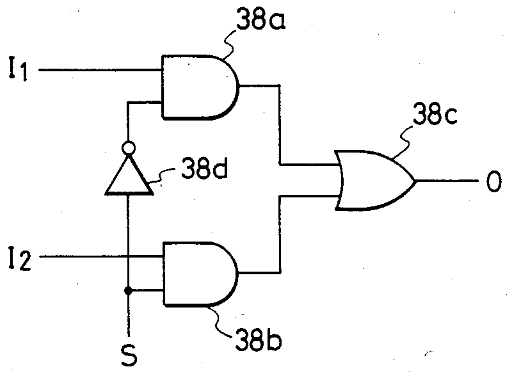
FIG. 3 is a circuit diagram embodiment of the select circuits shown in the device in FIG. 2.
Figure 4:
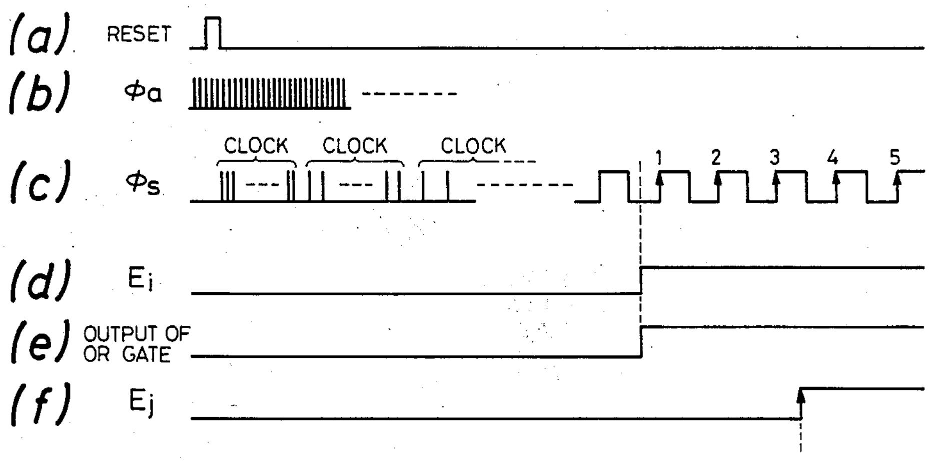
FIG. 4 is a time chart of signals generated during the operation of the device in FIG. 2.

A preferred embodiment of the select circuits 81 through 81N is shown in FIG. 3. In that preferred embodiment, the select circuit includes AND gates 38*a* and 38*b*, OR gate 38*c*, and inverter 38*b*. When the input signal S is at a "1" level, the output of the AND gate 38*a* is held at a "0" level and the signal at input $I_2$ is provided to output terminal O. When the input signal S is at a "0" level, the output of AND gate 38*b* is held at a "0" level and the signal at input $I_1$ is provided at the output terminal O. The operation of the time measuring device in FIG. 2 can best be described with reference to the timing charts of FIG. 4. The operation of the circuit in FIG. 2 begins when a reset signal (FIG. 4(*a*)) resets the contents of counter 23 and shift register 26. At this time instant, output signal $Q_1$ of shift register 26 is equal to "0" so select circuit 81 outputs clock signal $\phi_0$ as shown in FIG. 4(*b*). When none of the phenomena has occurred, all the signals E are at a "0" level. This condition sets the output of OR gate 21 to a "0" level and the output of inverter 25 to a "1" level. When the output of inverter 25 is at a "1" level, the output of the 1/K frequency divider 27, $\phi_T$, passes through AND gate 24*b* into the clock input of shift register 26.

As the circuit continues to operate prior to the occurrence of a phenomenon, clock signals $\phi_T$ continue to be sent to the clock signal input of shift register 26 and eventually the following condition is established:

$$Q_1 = \ldots = Q_j = \text{"1" and}$$

$$Q_{j+1} = \ldots = Q_n = \text{"0"}$$

In this condition, j ($\frac{1}{2}$) frequency dividers (91 through 9J) are used by selectors 81–8J and a clock signal $\phi_S$ (FIG. 4(*c*)) is obtained by subjecting the clock signal $\phi_0$ to j ($\frac{1}{2}$) frequency divisions. In the embodiment of the invention shown in FIG. 2, a shift clock pulse $\phi_T$ from 1/K frequency divider 27 is applied to shift register 26 through AND gate 24*b* every K periods of clock signal $\phi_S$.

As long as the output of inverter 25 is at a "1" level, another $\frac{1}{2}$ frequency divider is added every K periods of the clock signal $\phi_S$. This operation causes the period of $\phi_s$ first to double, then quadruple, etc. In other words, the frequency of clock signal $\phi_S$ equals the frequency of the original clock signal $\phi$ for the first K clock pulses, then decreases to $\frac{1}{2}$ of that frequency for the next K clock pulses, and then decreases by $\frac{1}{2}$ again during the succeeding K clock pulses, and so on until $Q_n = 1$ or until a reset occurs. Thus, as long as the system is not interrupted, the period of clock signal $\phi_S$ is substantially proportional to the time elapsed from the start of the measurement, so the relative accuracy of the measurement corresponds substantially to the elapsed time.

The earliest of the phenomena associated with signals $E_1$ through $E_m$ which occurs will be phenomenon i corresponding to signal $E_i$ (FIG. 4(*d*)). When that earliest phenomenon occurs, the output of OR gate 21 is raised to "1" as shown in FIG. 4(*e*) and the clock signal $\phi_S$/s passed through AND gate 24*a* and counted by the counter 23. When another phenomenon later occurs, e.g. one associated of with signal $E_j$ (FIG. 4(*f*)), signal $E_j$ acts as a strobe signal for the respective latch circuit 22*j* causing it to latch the output of the counter 23. In the example shown by FIG. 4, a "3" is recorded. When the earliest occurring phenomenon occurs, the content of the counter 23 is "0" and "0" is recorded in the respective latch circuit 22*i*.

When the earliest phenomenon occurs and generates signal $E_i$, the output of OR gate 21 is the raised to "1." In that case, the output of the inverter 25 drops to "0" and closes AND gate 24*b* which prevents shift clock pulses from changing shift register 26. Consequently, the period of the clock signal $\phi_S$ remains unchanged.

Later, when the phenomena corresponding to the other circuits $E_1$ through $E_m$ occurs, data representing the time of their occurrence are recorded in the appropriate latch circuits $22_1$ through $22_m$, with the time that the earliest phenomenon occurred being the reference point (t=0). In this recording operation, the frequencies of the clock pulses used correspond to the elapsed times from the start of the measurement. Therefore, the data thus obtained are effective and significant.

The circuit of FIG. 2 may be modified to eliminate AND gate 24*b* and inverter 25, and to apply the output of 1/K frequency divider 27 directly to the clock terminal of shift register 26. In this case, the time measurement is carried out in such a manner that the period of the clock signal $\phi_S$ is increased even after the output of the OR gate 21 is raised to "1."

It will be apparent to persons or ordinary skill that various modifications and variations can be made in the time measurement device of this invention without departing from the spirit and scope of the inventive concept. The present invention is intended to cover all such variations and modifications which come within the scope and spirit of the appended claims and their equivalents.

What is claimed is:

1. A device for measuring the time period between the onset of two phenomena, said device comprising:

input means for receiving occurrence signals indicating the onset of said phenomena;

clock means, coupled to said input means, for generating a timing signal composed of repeating pulses with non-decreasing periods which are equal for a predetermined number of said pulses and then increase, said clock means including clock input means for receiving a reference clock signal having a relatively constant frequency, first frequency-division means, coupled to said clock input means, for forming said timing signal by frequency dividing said reference clock signal by an amount determined according to a frequency division control signal, timing control means, coupled to said first frequency-division means, for generating said frequency division control signal from a subfrequency signal which has been divided down from said timing signal and from the one of said occurrence signals which said input means receives first, and second frequency-division means, coupled to said first frequency-division means, for frequency dividing said timing signal by said predetermined number, thereby forming said subfrequency signal; and count means, coupled to said clock means and responsive to said occurrence signals, for counting the number of pulses of said timing signal generated by said clock means between said occurrence signals thereby to measure said time period between the onset of said phenomena.

2. The device in claim 1 wherein said timing control means includes a control circuit for generating a first number of frequency divider signals; and wherein said first frequency-division means includes a first number of frequency dividers each having an input terminal and an output terminal, and a first number of selector circuits each corresponding to a different one of said frequency dividers and each having a control terminal, first and second input terminals, and an output terminal, said first input terminals of each of said selector circuits being coupled to receive said reference clock signal and said control terminals of each of said selector circuits being coupled to receive a different one of said frequency divider signals, and wherein said selector circuits and said frequency dividers are serially connected in an alternate fashion such that the output terminal of each of said frequency dividers is connected to the second input terminal of the corresponding selector circuit and the output terminal of each of said selector circuits is coupled to the input terminal of a different one of said frequency-division circuits, except for a first one of said frequency dividers whose input terminal is coupled to receive said reference clock signal and a last one of said selector circuits whose output terminal presents said timing signal.

3. The device of claim 2 wherein said control circuit includes:

a logic circuit for generating a shift signal from said occurrence signals and said subfrequency signal, and a shift register having a data input coupled to receive a predetermined signal and a clock input coupled to receive said shift signal, and wherein said frequency divider signals are produced at data outputs of said shift register.

4. The device of claim 3 wherein said logic circuit includes an OR gate coupled to receive said occurrence signals, an inverter coupled to an output of said OR gate, and an AND gate coupled to an output of said inverter and coupled to receive said subfrequency signal, and said AND gate having an output terminal presenting said shift signal.

5. The device of claim 1 wherein said count means includes a counter having an input terminal coupled to receive said timing signal and output terminals presenting a count signal, and two latches each having input terminals coupled to said output terminals of said counter and each having a store terminal coupled to receive a different one of said occurrence signals to store said count signal in response to said occurrence signal, said latches thereby containing values representing said time period.

6. A device for measuring the times when a plurality of phenomena occur during a measuring operation, said device comprising:

clock generation means for generating a sequence of clock pulses during said measuring operation, said clock generation means including period adjustment means for increasing the period of said clock pulses after a predetermined number of said clock pulses have been generated;

detection means for detecting when an earliest one of said phenomena first occurs;

counting means, responsive to said detection means, for counting the number of said clock pulses generated between the occurrence of said earliest phenomena and the occurrences of the other of said phenomena; and storage means for storing the resultant counts from said counting means for each of the other of said phenomena.

7. The time measuring device of claim 6 wherein said clock pulse generating means includes means, coupled to said detection means, for disabling said period adjusting means after the occurrence of said earliest phenomena, thereby causing said clock generation means to generate said clock pulses with substantially the same period after the occurrence of said earliest phenomena.

* * * * *